United States Patent
Woo et al.

(10) Patent No.: US 11,239,210 B2
(45) Date of Patent: Feb. 1, 2022

(54) SEMICONDUCTOR DIE FOR DETERMINING LOAD OF THROUGH SILICON VIA AND SEMICONDUCTOR DEVICE INCLUDING THE SAME

(71) Applicant: Samsung Electronics Co., Ltd., Suwon-si (KR)

(72) Inventors: SeungHan Woo, Seoul (KR); Je Min Ryu, Seoul (KR); Reum Oh, Hwaseong-si (KR); Moonhee Oh, Osan-si (KR); BumSuk Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/124,762

(22) Filed: Dec. 17, 2020

(65) Prior Publication Data

US 2021/0104498 A1  Apr. 8, 2021

Related U.S. Application Data

(62) Division of application No. 16/125,975, filed on Sep. 10, 2018, now Pat. No. 10,916,525.

(30) Foreign Application Priority Data

Mar. 12, 2018  (KR) .......................... 10-2018-0028545

(51) Int. Cl.
*H01L 25/065* (2006.01)
*H01L 23/48* (2006.01)
(Continued)

(52) U.S. Cl.
CPC ...... *H01L 25/0657* (2013.01); *G01R 31/2853* (2013.01); *H01L 23/481* (2013.01);
(Continued)

(58) Field of Classification Search
CPC ... H01L 23/481; H01L 24/16; H01L 25/0657; H01L 25/18; H01L 2224/6146; H01L 2225/06541
See application file for complete search history.

(56) References Cited

U.S. PATENT DOCUMENTS

| | | | |
|---|---|---|---|
| 7,977,962 B2 * | 7/2011 | Hargan | .................. H01L 22/32 |
| | | | 324/762.01 |
| 8,680,874 B2 * | 3/2014 | Minas | ................ G01R 31/2853 |
| | | | 324/606 |

(Continued)

FOREIGN PATENT DOCUMENTS

KR  10-2012-0062281  6/2012
KR  10-1212777 B1  12/2012
(Continued)

*Primary Examiner* — Mamadou L Diallo
(74) *Attorney, Agent, or Firm* — Harness, Dickey & Pierce, P.L.C.

(57) ABSTRACT

A semiconductor die may include a first delay circuit formed on a substrate and configured to delay a test signal, the first delay circuit including first delay stages connected in series, a second delay circuit formed on the substrate and configured to delay the test signal, the second delay circuit including second delay stages connected in series, at least one through silicon via connected to at least one output terminal of output terminals of the first delay stages, the at least one through silicon via penetrating through the substrate, and a load determinator configured to compare a first delay signal output from one of the first delay stages with a second delay signal output from one of the second delay stages and determine a load of the at least one through silicon via.

12 Claims, 9 Drawing Sheets

(51) Int. Cl.
*H01L 25/18* (2006.01)
*H01L 23/00* (2006.01)
*G01R 31/28* (2006.01)

(52) U.S. Cl.
CPC .............. *H01L 24/16* (2013.01); *H01L 25/18* (2013.01); *H01L 2224/16146* (2013.01); *H01L 2225/06513* (2013.01); *H01L 2225/06541* (2013.01); *H01L 2225/06596* (2013.01)

(56) References Cited

U.S. PATENT DOCUMENTS

| | | | |
|---|---|---|---|
| 9,239,359 B2 * | 1/2016 | Marinissen | G01R 31/318508 |
| 2010/0259435 A1 * | 10/2010 | Yamamoto | H03K 5/1508 |
| | | | 341/166 |
| 2011/0175639 A1 * | 7/2011 | Yoko | H01L 25/0657 |
| | | | 324/762.06 |
| 2012/0138927 A1 * | 6/2012 | Kang | G01R 31/318513 |
| | | | 257/48 |
| 2012/0274348 A1 * | 11/2012 | Shin | G01R 31/318513 |
| | | | 324/762.01 |
| 2014/0266291 A1 * | 9/2014 | Fkih | H01L 22/14 |
| | | | 324/762.01 |
| 2015/0061721 A1 * | 3/2015 | Jeong | G11C 29/025 |
| | | | 324/762.01 |
| 2017/0059648 A1 * | 3/2017 | Woo | G01R 31/2853 |
| 2017/0343602 A1 * | 11/2017 | Li | G01R 31/2882 |

FOREIGN PATENT DOCUMENTS

| | | |
|---|---|---|
| KR | 10-2015-0025858 | 3/2015 |
| KR | 10-2017-0025988 | 3/2017 |

\* cited by examiner

SEMICONDUCTOR DIE FOR DETERMINING LOAD OF THROUGH SILICON VIA AND SEMICONDUCTOR DEVICE INCLUDING THE SAME

CROSS-REFERENCE TO RELATED APPLICATIONS

This application is a divisional application of U.S. application Ser. No. 16/125,975, filed On Sep. 10, 2018, which claims priority under 35 U.S.C. § 119 to Korean Patent Application No. 10-2018-0028545, filed on Mar. 12, 2018, in the Korean Intellectual Property Office, the entire contents of each of which are hereby incorporated by reference.

BACKGROUND

Example embodiments of the present disclosure relate to a semiconductor die and/or a semiconductor device including the same. For example, at least some example embodiments relate to a semiconductor die for determining a load of a through silicon via, and/or a semiconductor device including the same.

A plurality of semiconductor dies are stacked to increase an integration density of a semiconductor device. In the case where a semiconductor device has a three-dimensional structure, it is possible to increase an amount of data to be stored in or processed by the semiconductor device. To form a three-dimensional semiconductor device, various packaging technologies may be applied to semiconductor dies. For example, since a through silicon via (TSV) is suitable for miniaturization and high speed of a semiconductor device, the TSV may be used to stack semiconductor dies.

TSVs are formed to vertically penetrate through a substrate of a semiconductor die. A test process may be performed to determine whether the TSVs are normally formed by testing whether there is a defect in the TSV.

SUMMARY

Since a semiconductor device may operate at high speed, rather than only determine whether a defect is present in a TSV, in one or more example embodiments, a semiconductor die is configured to calculate or determine a load of the TSV.

Some example embodiments of the inventive concepts provide a semiconductor die for determining a load of a through silicon via, and a semiconductor device including the same.

According to some example embodiments of the inventive concepts, a semiconductor die may include a first delay circuit on a substrate, the first delay circuit configured to delay a test signal to generate a first delay signal, the first delay circuit including first delay stages connected in series, the first delay stages including output terminals; a second delay circuit on the substrate, the second delay circuit configured to delay the test signal to generate a second delay signal, the second delay circuit including second delay stages connected in series; at least one through silicon via connected to at least one of the output terminals of the first delay stages, the at least one through silicon via penetrating through the substrate; and processing circuitry configured to determine a load of the at least one through silicon via based on the first delay signal and the second delay signal.

According to some example embodiments of the inventive concepts, a semiconductor device may include a first semiconductor die including, first delay stages connected in series, the first delay stages configured to receive a test signal, one of the first delay stages configured to output a first delay signal, second delay stages connected in series, the second delay stages configured to receive the test signal, one of the second delay stages configured to output a second delay signal, at least one first through silicon via connected to at least one output terminal of output terminals of the first delay stages, and processing circuitry configured to determine a load of the at least one first through silicon via and at least one second through silicon via based on the first delay signal and the second delay signal; and a second semiconductor die stacked on the first semiconductor die, the second semiconductor die including the at least one second through silicon via electrically connected to the at least one first through silicon via.

According to some example embodiments of the inventive concepts, a semiconductor device may include a first semiconductor die including at least one first through silicon via; and a second semiconductor die stacked on the first semiconductor die, the second semiconductor die including, first delay stages connected in series, the first delay stages including output terminals, one of the first delay stages configured to output a first delay signal, second delay stages connected in series, one of the second delay stages configured to output a second delay signal, at least one second through silicon via electrically connected to at least one of the output terminals of the first delay stages and the at least one first through silicon via, a transmitter configured to transmit a test signal received from the first semiconductor die to the first delay stages and the second delay stages, and processing circuitry configured to determine a load of the at least one first through silicon via and the at least one second through silicon via based on the first delay signal and the second delay signal.

DETAILED DESCRIPTION

Example embodiments of the inventive concepts will now be described more fully with reference to the accompanying drawings, in which example embodiments are shown.

Figure 1:
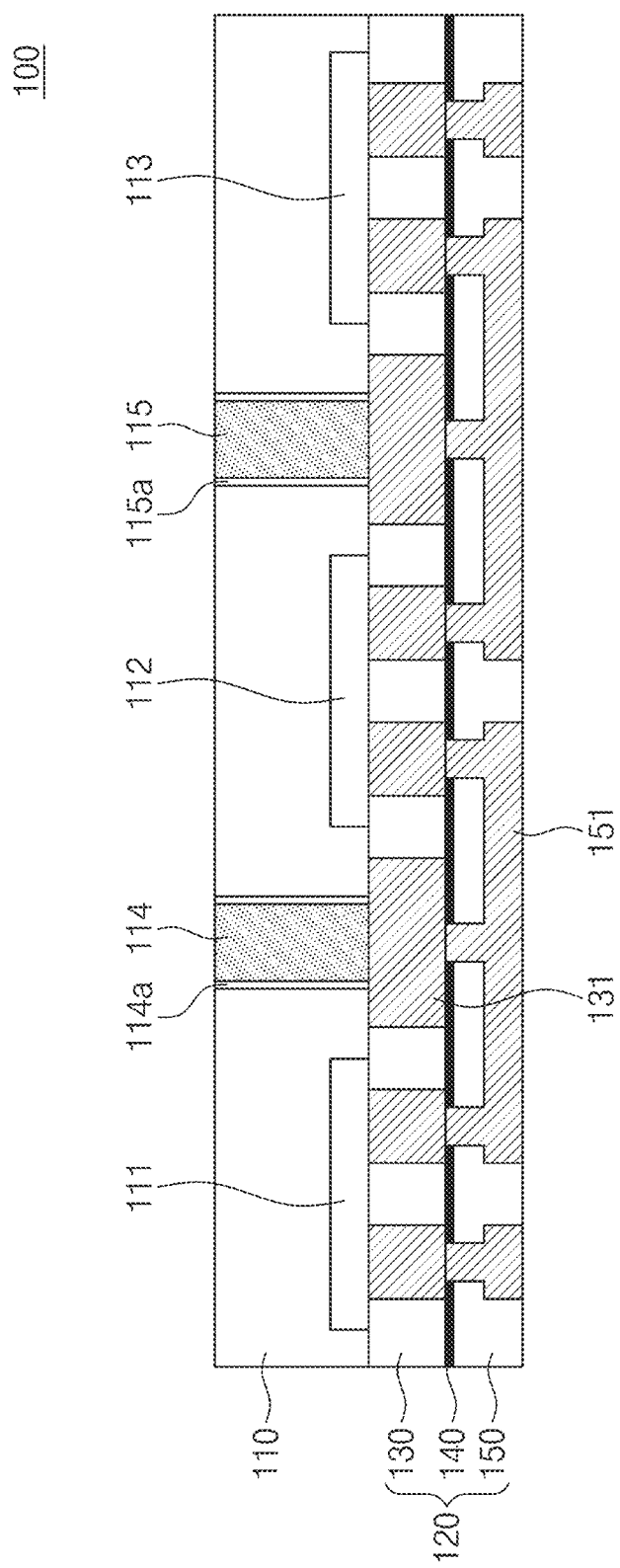
FIG. 1 is a sectional view illustrating a semiconductor die according to an example embodiment of the inventive concepts.

FIG. 1 is a sectional view illustrating a semiconductor die according to an example embodiment of the inventive concepts.

Referring to FIG. 1, a semiconductor die 100 may include a substrate 110 and an interconnection layer 120, and here, the substrate 110 may be formed of a semiconductor material (e.g., silicon).

The substrate 110 may include first to third circuit regions 111-113. Although three circuit regions (e.g., 111-113) are illustrated in FIG. 1, example embodiments of the inventive concepts are not limited to the number of the circuit regions. The first to third circuit regions 111-113 may be separated by first and second through silicon vias (TSVs) 114 and 115.

Various elements constituting an integrated circuit may be integrated on each of the first to third circuit regions 111-113. For example, source, drain, and body regions of an element (or a transistor) may be provided on each of the first to third circuit regions 111-113. The integrated circuit may include a memory cell array, a peripheral circuit controlling the memory cell array, a logic circuit, or a combination thereof. In some example embodiments, the semiconductor die 100 may be referred to as a memory die. However, in other example embodiments, the semiconductor die 100 may be an application processor (AP) or a system-on-chip (SoC).

The substrate 110 may include the first and second TSVs 114 and 115. However, example embodiments of the inventive concepts are not limited to the number of the TSVs shown in FIG. 1. The first and second TSVs 114 and 115 may penetrate through the substrate 110 in a vertical direction. The first and second TSVs 114 and 115 may provide paths for exchanging signals with another semiconductor die (not shown) stacked on the semiconductor die 100.

The first TSV 114 may be formed of or include at least one of conductive materials (e.g., polysilicon, copper, tungsten, or aluminum). The first TSV 114 may have a pillar shape filled in a via hole. A first insulator 114a may be formed using insulating materials such as silicon oxide. The first insulator 114a may be configured to cover, enclose or surround a side of the first TSV 114. The first insulator 114a may be configured to prohibit a conductive material in the first TSV 114 from being diffused into the substrate 110. The second TSV 115 and a second insulator 115a may be implemented in the same manner as the first TSV 114 and the first insulator 114a.

The interconnection layer 120 may be disposed or located on the substrate 110. A first insulating layer 130 may be disposed on the substrate 110, a barrier layer 140 may be disposed on the first insulating layer 130, and a second insulating layer 150 may be disposed on the barrier layer 140.

Each of the first and second insulating layers 130 and 150 may be formed of or include insulating materials (e.g., silicon oxide). For electric connections between elements of the integrated circuit or between the elements and TSVs, metal lines may be formed in each of the first and second insulating layers 130 and 150. The barrier layer 140 may be configured to prohibit diffusion of metallic elements, which are contained in the metal lines provided in the first insulating layer 130.

In the first insulating layer 130, first metal lines 131, which are electrically connected to the first circuit region 111, the second circuit region 112, the third circuit region 113, the first TSV 114, and/or the second TSV 115, may be disposed. The first metal lines 131 may include metallic materials such as copper, tungsten, aluminum, or a combination thereof. In the second insulation layer 150, second metal lines 151, which electrically connect the first metal lines 131, may be disposed. The second metal lines 151 may be implemented to be similar to the first metal lines 131. In some example embodiments, the first and second metal lines 131 and 151 may be formed to be different from that of FIG. 1.

In some example embodiments, a test circuit for testing the first and second TSVs 114 and 115 may be disposed in one or more of the first to third circuit regions 111-113. According to some example embodiments of the inventive concepts, in addition to determining whether the first and second TSVs 114 and 115 are normally formed, the test circuit may also determine or measure a load of the first and second TSVs 114 and 115. Hereinafter, the test circuit will be described in more detail below.

Figure 2:
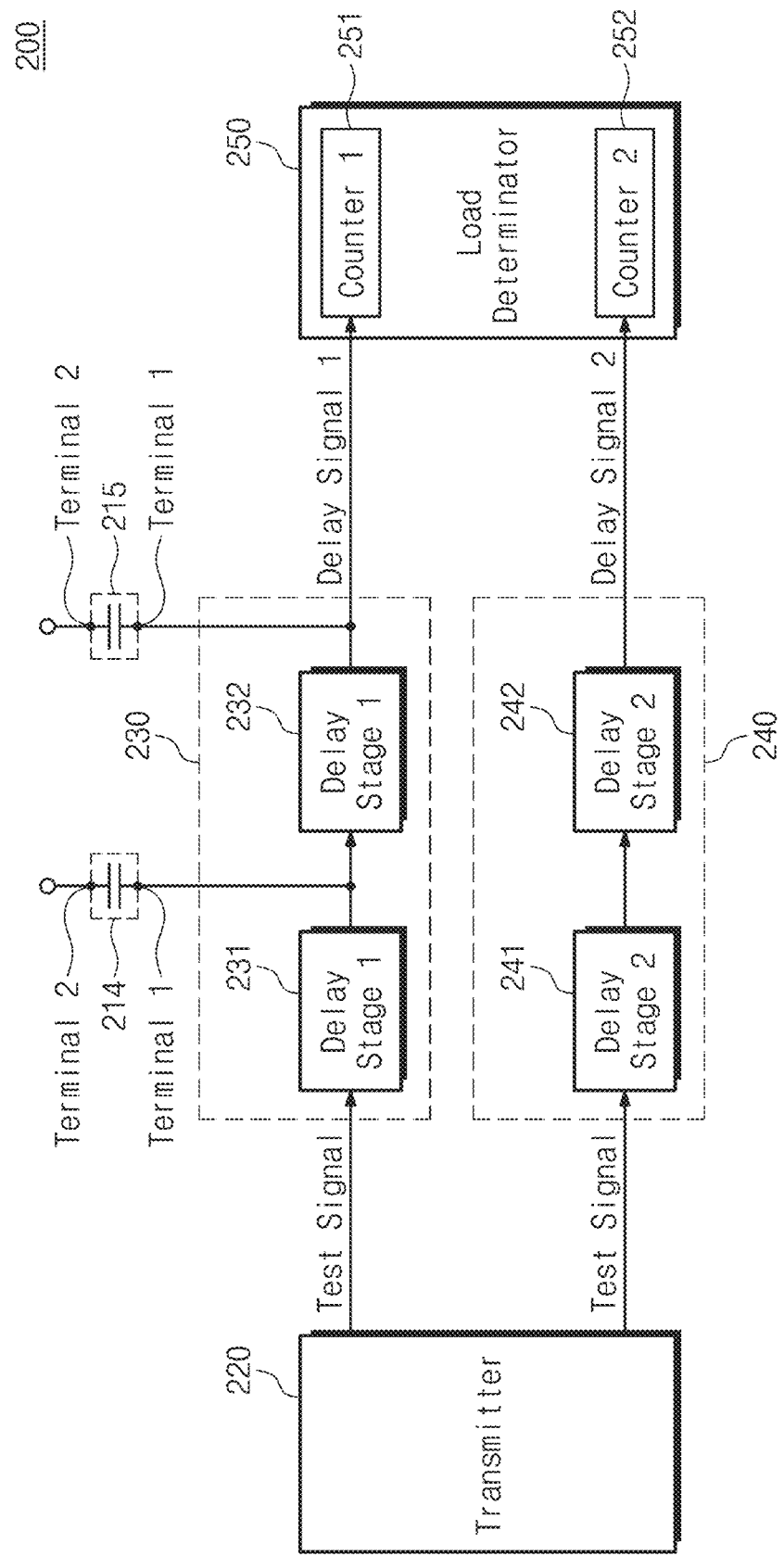
FIG. 2 is a block diagram illustrating a test circuit according to an example embodiment of the inventive concepts.

FIG. 2 is a block diagram illustrating a test circuit according to an example embodiment of the inventive concepts. The test circuit will be described with reference to FIG. 2, along with FIG. 1.

Referring to FIGS. 1 and 2, a test circuit 200 may determine or measure a load of first and second TSVs 214 and 215. Here, the load of the TSV may be a parameter representing resistance, inductance, and capacitance of the TSV. All of resistance, inductance, and capacitance of an ideal TSV may be zero, and the ideal TSV may not alter a signal passing therethrough. However, in reality, each of the resistance, inductance, and capacitance of the TSV may have a non-vanishing value. Thus, it may be desirable to determine a load of a TSV, which affects a signal passing through the TSV and represents all of resistance, inductance, and capacitance of the TSV.

The test circuit 200 may be formed on a substrate in which the first and second TSVs 214 and 215 are formed. The test circuit 200 may include the first and second TSVs 214 and 215, a transmitter 220, first and second delay circuits 230 and 240, and a load determinator 250. Example embodiments of the inventive concepts are not limited to the number of the first and second TSVs 214 and 215 shown in FIG. 2, and in an example embodiment, the number of the TSV may be at least one. The TSV may be modeled using at least one of passive elements of a resistor, an inductor, and a capacitor. The resistor, inductor, and capacitor may represent resistance, inductance, and capacitance of the TSV, respectively.

Referring to FIG. 2, the first and second TSVs 214 and 215 may be the first and second TSVs 114 and 115 of FIG. 1. First, referring back to FIG. 1, another semiconductor die may not be stacked on the semiconductor die 100 or the semiconductor die 100 may not be stacked on another semiconductor die. The first terminals of the first and second TSVs 114 and 115 may be electrically connected to the first metal lines 131 but the second terminals of the first and second TSVs 114 and 115 may be in a floating state.

In the afore-described case, each of the first and second TSVs 214 and 215 may be modeled using a capacitor which has a first terminal electrically connected to the first metal lines 131 and a second terminal in a floating state, as shown in FIG. 2. First terminals of the first and second TSVs 214 and 215 may be connected to the first delay circuit 230, and second terminals of the first and second TSVs 214 and 215 may be in a floating state.

FIG. 2 illustrates an example in which each of the first and second TSVs 214 and 215 is modeled using a capacitor. Although not shown in FIG. 2, each of the first and second TSVs 214 and 215 may be modeled using a resistor or an inductor, in addition to the capacitor. In this case, the resistor, the inductor, or the capacitor may be modeled to be electrically connected in series or parallel to each other. The first and second TSVs 214 and 215 may be referred to as circuits of which the first and second TSVs 114 and 115 of FIG. 1 are modeled.

The transmitter 220 may transmit a test signal to each of the first and second delay circuits 230 and 240. For example, the test signal may be a pulse signal or clock which transition in a periodic or non-periodic manner. A logic state of the test signal may be changed in the periodic or non-periodic manner, similar to the pulse signal or clock. In some example embodiments, the transmitter 220 may receive a test signal from the outside of the semiconductor die 100 (e.g., from another semiconductor die or a test device) through at least one pad and may output the received test signal to each of the first and second delay circuits 230 and 240. In other example embodiments, the transmitter 220 may internally generate the test signal.

The first delay circuit 230 may include first delay stages 231 and 232 which are connected in series. The first delay circuit 230 may be formed or disposed on the substrate. Each of the first delay stages 231 and 232 may transmit a received signal to a next delay stage connected in series thereto. Each of the first delay stages 231 and 232 may include at least one logic gate. For example, the logic gate may include at least one of an inverter, a NAND gate, a NOR gate, a AND gate, a OR gate, a XOR gate, a XNOR gate, and so on. The logic gate may perform various bit operations. The first delay stages 231 and 232 may be identical to each other. The final first delay stage 232 may transmit a delayed test signal to the load determinator 250.

In some example embodiments, the final first delay stage 232 may transmit a delayed test signal to a buffer (not shown), and the buffer may transmit the delayed test signal to the load determinator 250. In other words, an output signal of the final first delay stage 232 may not be directly transmitted to the load determinator 250. The buffer may include at least one logic gate and may be implemented to be the same as each of the first delay stages 231 and 232.

The second delay circuit 240 may include second delay stages 241 and 242 which are connected in series. The second delay circuit 240 may be formed or disposed on the substrate. Each of the second delay stages 241 and 242 may transmit a received signal to a next delay stage connected in series thereto. Each of the second delay stages 241 and 242 may include at least one logic gate. The second delay stages 241 and 242 may be identical to each other. The final second delay stage 242 may transmit a delayed test signal to the load determinator 250. In some example embodiments, the final second delay stage 242 may transmit a delayed test signal to a buffer (not shown), and the buffer may transmit the delayed test signal to the load determinator 250.

The first and second delay circuits 230 and 240 may be implemented to be similar to each other. Each of the first delay stages 231 and 232 may be the same as each of the second delay stages 241 and 242. However, loads of the first delay stages 231 and 232 may be different from loads of the second delay stages 241 and 242.

In some example embodiments, unlike that shown in FIG. 2, the number of the first delay stages 231 and 232 may not be equal to the number of the first and second TSVs 214 and 215. The number of the TSV may be at least one, and the at least one TSV may be connected to at least one output terminal of the first delay stages 231 and 232. By contrast, output terminals of the second delay stages 241 and 242 may not be connected to the at least one TSV.

A propagation delay of one of the first delay stages 231 and 232 connected to the at least one TSV may be determined, based on input capacitance of each of the first delay stages 231 and 232, a load of a metal line electrically connecting the first delay stages 231 and 232, and a load of the at least one TSV. A propagation delay of each of the second delay stages 241 and 242 may be determined, based on input capacitance of each of the second delay stages 241 and 242 and a load of a metal line electrically connecting the second delay stages 241 and 242 to each other. In other words, the propagation delay of each of the second delay stages 241 and 242 may not be affected by the load of the TSV. In some example embodiments, the term propagation delay may mean a delay imposed by an individual delay stage on a signal passing through the individual delay stage.

In some example embodiments, the output terminals of the first delay stages 231 and 232 may be connected to the first and second TSVs 214 and 215, respectively, as shown in FIG. 2. In other words, the number of the first delay stages 231 and 232 may be equal to the number of the first and second TSVs 214 and 215. By contrast, the output terminals of the second delay stages 241 and 242 may not be connected to the first and second TSVs 214 and 215. Since the propagation delay of each of the second delay stages 241 and 242 is not affected by the load of the TSV, the propagation delay of each of the first delay stages 231 and 232 may be greater than the propagation delay of each of the second delay stages 241 and 242.

In some example embodiments, the inventive concepts are not limited to the number of the first delay stages 231 and 232 and the number of the second delay stages 241 and 242 shown in FIG. 2. The number of the first delay stages 231 and 232 may be determined, based on the number of the first and second TSVs 214 and 215 which are target objects for load determination. As the number of the first and second TSVs 214 and 215 increases, the delay difference between the first delay signal and the second delay signal may increase. As the delay difference between the first delay signal and the second delay signal increases, the load of the first and second TSVs 214 and 215 may be determined. For example, the number of the second delay stages 241 and 242 may be equal to the number of the first delay stages 231 and 232.

A test signal may pass through the first delay stages 231 and 232, sequentially. Similarly, a test signal may pass through the second delay stages 241 and 242, sequentially. Since the propagation delay of at least one of the first delay stages 231 and 232 is greater than the propagation delay of each of the second delay stages 241 and 242, the first delay signal may be further delayed than the second delay signal. The delay difference (or a phase difference) between the first and second delay signals may be determined based on a load of at least one TSV or the load of the first and second TSVs 214 and 215. That is, when comparing the first delay signal with the second delay signal, it may be determined or measured a load of at least one TSV.

The propagation delay of each of the first delay stages 231 and 232 may be increased due to a load (resistance, inductance, and capacitance) of a metal line to form a series connection between the first delay stages 231 and 232 and a connection to the TSV. Accordingly, to reduce the afore-described effect caused by the load of the metal line, the first delay stages 231 and 232 may be disposed adjacent to the first and second TSVs 214 and 215. For example, an output terminal of the first delay stage 231 may be electrically connected to a first terminal of the first TSV 214 and an input terminal of the first delay stage 232 through the first and second metal lines 131 and 151. As the lengths of the first and second metal lines 131 and 151 are decreased, the load of the first and second metal lines 131 and 151 may be decreased.

As the load of the first and second metal lines 131 and 151 decrease, the output signal of the first delay stage 231 may be mainly delayed by the load of the first TSV 214. For example, the first delay stage 231 may be disposed in the first circuit region 111, and the first delay stage 232 may be disposed in the second circuit region 112. The test circuit 200 may be disposed and distributed in several circuit regions, as described above, but the test circuit 200 may be disposed in one circuit region that is separated from a region for the TSVs.

Even when the lengths of the first and second metal lines 131 and 151 are decreased, the propagation delay of each of the first delay stages 231 and 232 may be however increased because of the load of the first and second metal lines 131 and 151. In some example embodiments, to exclude an undesired effect caused by the load of the first and second metal lines 131 and 151, except for the first and second TSVs 214 and 215 connected to the first delay circuit 230, the second delay circuit 240 may be implemented to be the same as the first delay circuit 230.

In more detail, except that the first terminal of the first TSV 214 is connected to the metal line connecting the first delay stages 231 and 232, the metal line connecting the second delay stages 241 and 242 may be implemented to be the same as the metal line connecting the first delay stages 231 and 232. Thus, when comparing the first delay signal with the second delay signal, only the load of the TSV from which the load of the metal line between the delay stages is excluded may be determined.

In addition, the propagation delay of each of the first delay stages 231 and 232 may be increased by the input capacitance of each of the first delay stages 231 and 232. Thus, to exclude an undesired effect caused by the input capacitance of each of the first delay stages 231 and 232, the second delay stages 241 and 242 may be implemented to be the same as the first delay stages 231 and 232. When comparing the first delay signal with the second delay signal, only the load of the TSV from which the input capacitance of the delay stage is excluded may be determined.

To sum up, to precisely determine only a load of at least one TSV, the second delay stages 241 and 242 may be implemented to be the same as the first delay stages 231 and 232, the second delay stages 241 and 242 may be disposed adjacent to the first delay stages 231 and 232, and the metal line connecting the first delay stages 231 and 232 may be implemented to be the same as the metal line connecting the second delay stages 241 and 242. In other words, the second delay stage 241 along with the first delay stage 231 may be disposed in the first circuit region 111, and the second delay stage 242 along with the first delay stage 232 may be disposed in the second circuit region 112. The number of the second delay stages 241 and 242 may be equal to the number of the first delay stages 231 and 232.

By implementations and dispositions described above, if the first delay signal is not delayed by the load of the at least one TSV, the second delay signal may be delayed the same as the first delay signal. That is, if the first delay signal is not delayed by the load of the at least one TSV, the delay amount of the first delay signal and the delay amount of the second delay signal may be identical to each other. The second delay signal may be a reference signal for determining the load of the at least one TSV.

In some example embodiments, the test circuit 200 may include processing circuitry (not shown). The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to implement the load determinator 250 to compare the first delay signal with the second delay signal and to determine the load of the at least one TSV connected to the first delay circuit 230. The load determinator 250 may be referred to as a load measuring device (or, alternatively, unit). The load determinator 250 may digitize the delay difference between the first and second delay signals in a digital manner. For example, to reduce the load of the first and second metal lines 131 and 151, the load determinator 250 may be disposed in the third circuit region 113 of FIG. 1.

In more detail, the load determinator 250 may include a first counter 251 and a second counter 252 operated in synchronization with the clock.

The first counter 251 may receive the first delay signal and count how long the first delay signal is delayed relative to the test signal. A first counting value of the first counter 251 may indicate the delay difference between the test signal and the first delay signal.

Similarly, the second counter 252 may receive the second delay signal and count how long the second delay signal is delayed relative to the test signal. A second counting value of the second counter 252 may indicate the delay difference between the test signal and the second delay signal. For example, each of the first and second counters 251 and 252 may be implemented using at least one flip-flop circuit in a digital manner. Although not shown in FIG. 2, each of the first and second counters 251 and 252 may further receive the test signal. The load determinator 250 may further include a comparator to compare the first counting value of the first counter 251 with the second counting value of the second counter 252.

For example, a difference between the first and second counting values may be proportional to a load of at least one TSV connected to the first delay circuit 230. For example, in the case where the first and second TSVs 214 and 215 are connected to the first delay circuit 230, a load of each of the first and second TSVs 214 and 215 may be determined based on the load is determined by the difference between the first and second counting values and the number of the TSVs.

In some example embodiments, in the case where the first TSV 214 or the second TSV 215 is failed or has a difficulty in transmitting a signal at a high speed, a total load of the first and second TSVs 214 and 215 may be excessively large. That is, the total load of the first and second TSVs 214 and 215 may be greater than a load corresponding to the largest counting value (or a maximum counting value) that can be obtained by the first counter 251. In this case, the first counter 251 may output the largest counting value and based on the largest counting value, it is determined that the first TSV 214 or the second TSV 215 is failed or has a difficulty in transmitting a signal at a high speed.

In some example embodiments, the load determinator 250 may further include a third counter (not shown) may count how long the first delay signal is delayed relative to the second delay signal. A third counting value of the third counter may indicate the delay difference between the first delay signal and the second delay signal. The third counting value of the third counter may be proportional to a load of at least one TSV connected to the first delay circuit 230.

Figure 3:
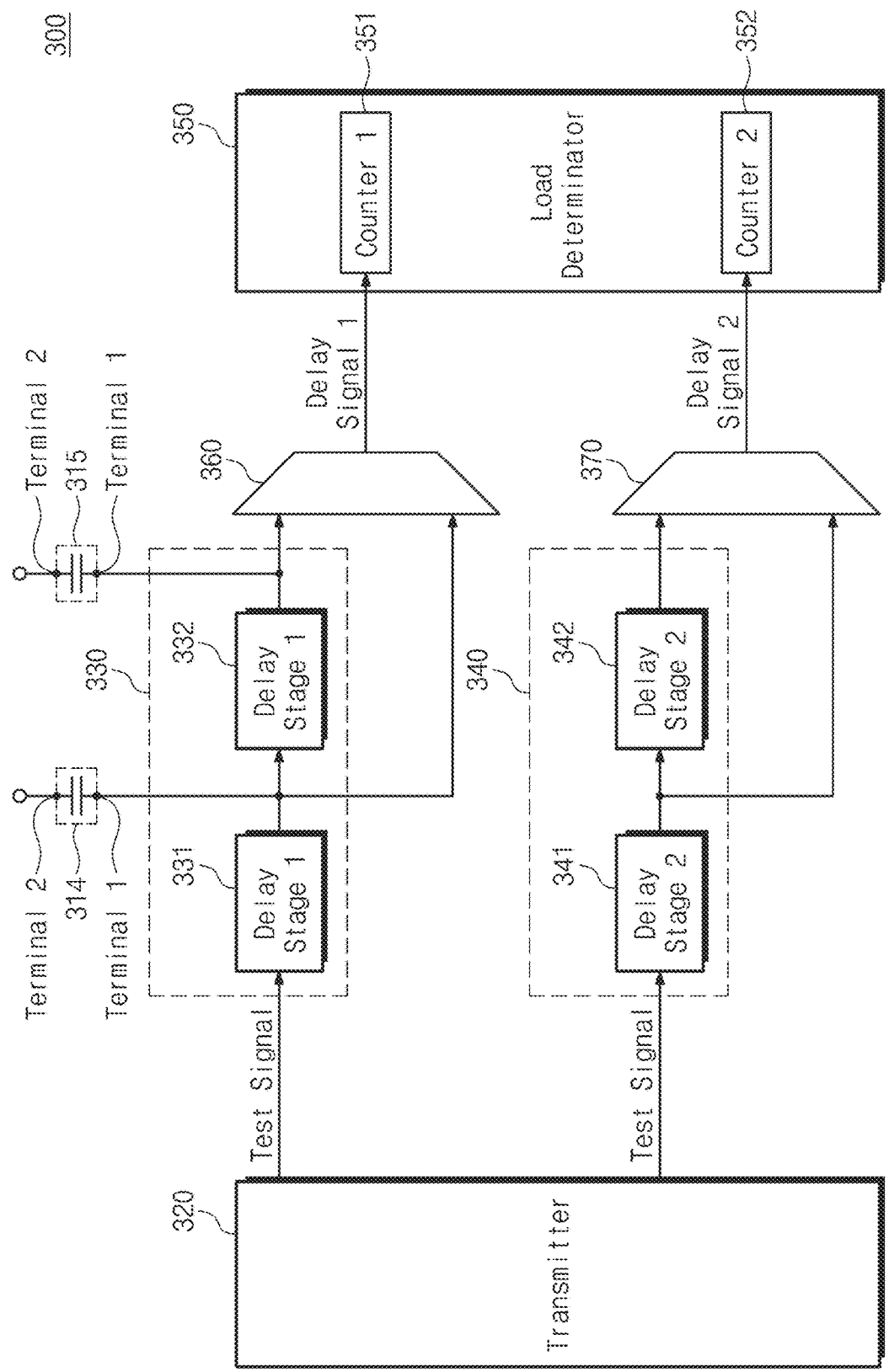
FIG. 3 is a block diagram illustrating a test circuit according to another example embodiment of the inventive concepts.

FIG. 3 is a block diagram illustrating a test circuit according to another embodiment of the inventive concept. The test circuit will be described in more detail with reference to FIG. 3, along with FIG. 2.

Referring to FIGS. 2 and 3, a test circuit 300 may include first and second TSVs 314 and 315, a transmitter 320, first and second delay circuits 330 and 340, and a load determinator 350. The first and second TSVs 314 and 315, the transmitter 320, the first and second delay circuits 330 and 340, and the load determinator 350 may be configured to be operated in a manner similar to corresponding elements (e.g., identified with similar reference numbers) of FIG. 2. Thus, in the following description of the test circuit 300, technical features different from the test circuit 200 will be described mainly.

The test circuit 300 may further include a first multiplexer 360 and a second multiplexer 370, unlike the test circuit 200. The first multiplexer 360 may select one of output signals of first delay stages 331 and 332 and may transmit the selected signal (e.g., a first delay signal) to the load determinator 350. The number of signals to be input to the first multiplexer 360 may be equal to the number of the first delay stages 331 and 332. Similarly, the second multiplexer 370 may select one of output signals of second delay stages 341 and 342 and may transmit the selected signal (e.g., a second delay signal) to the load determinator 350. The number of signals to be input to the second multiplexer 370 may be equal to the number of the second delay stages 341 and 342.

The load determinator 350 may compare the first delay signal output from one of the first delay stages 331 and 332 with the second delay signal output from one of the second delay stages 341 and 342. That is, the load determinator 350 may determine a load of all TSVs connected to the first delay stages 331 and 332 or a load of a part of TSVs connected to the first delay stages 331 and 332. In FIG. 3, the number of the first delay stages 331 and 332 through which the first delay signal is output may be equal to the number of the second delay stages 341 and 342 through which the second delay signal is output.

In some example embodiments, the test circuit 300 may further include buffers (not shown) connected to output terminals of the first delay stages 331 and 332, respectively and buffers (not shown) connected to output terminals of the second delay stages 341 and 342, respectively. In this case, the first multiplexer 360 may receive first delay signals output from the buffers. The second multiplexer 370 may also receive second delay signals output from the buffers.

In some example embodiments, the test circuit 300 may further include a control circuit (not shown).

The control circuit may include processing circuitry (not shown). The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

Therefore, in addition to implementing the load determinator 250, in some example embodiments, the processing circuitry may be configured, through a layout design or execution of computer readable instructions stored in a memory (not shown), as a special purpose computer to implement the control circuit to control the transmitter 320, the load determinator 350, the first multiplexer 360, and the second multiplexer 370. For example, the control circuit may control the transmitter 320 to generate a test signal. The control circuit may control the load determinator 350 to allow the result of the determination to be output by the load determinator 350. The control circuit may control the first and second multiplexers 360 and 370 to allow one of the output terminals of the first delay stages 331 and 332 and one of the output terminals of the second delay stages 341 and 342 to be selected by the first and second multiplexers 360 and 370.

Figure 4:
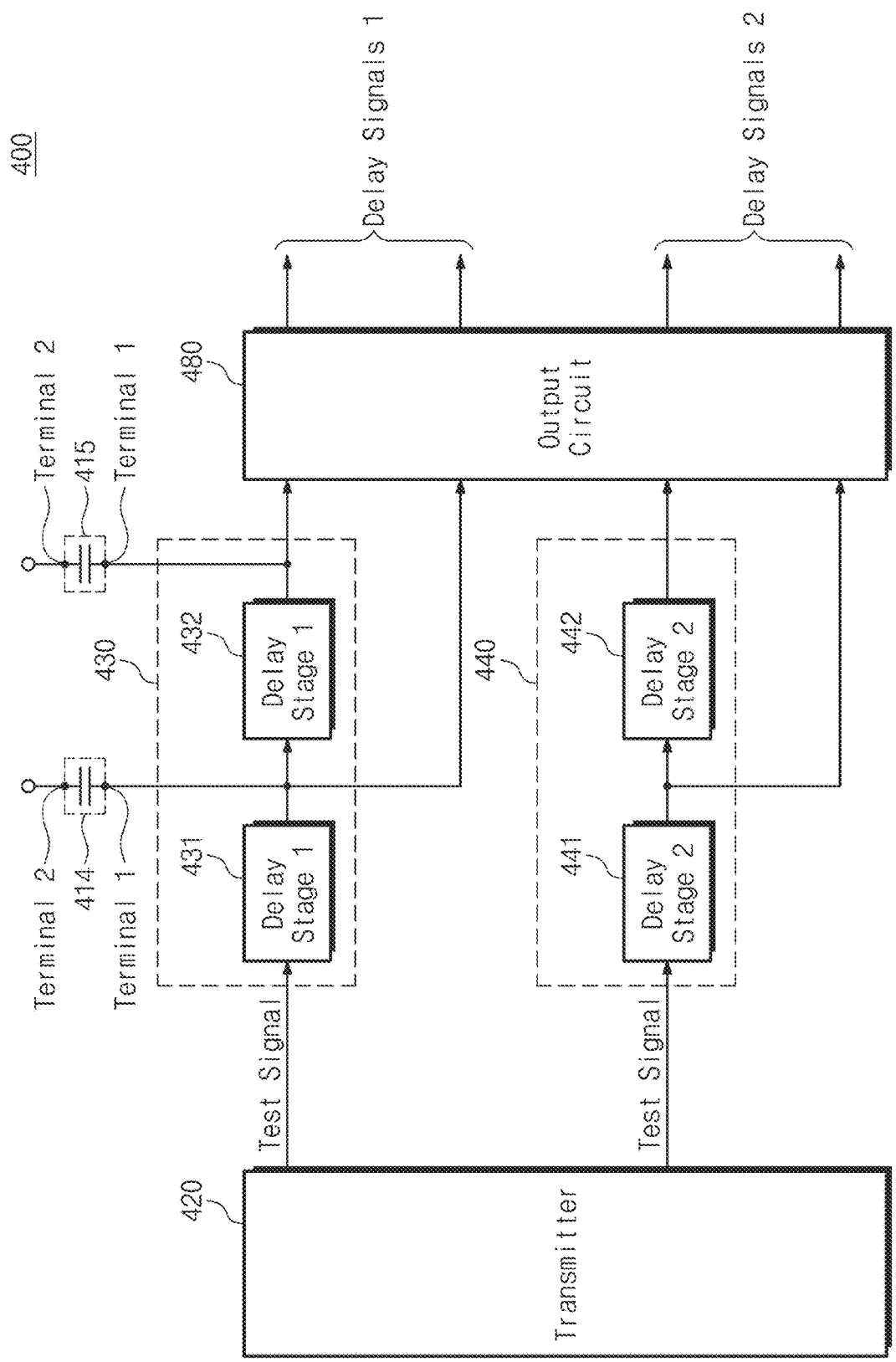
FIG. 4 is a block diagram illustrating a test circuit according to other example embodiment of the inventive concepts.

FIG. 4 is a block diagram illustrating a test circuit according to other example embodiment of the inventive concepts. The test circuit will be described in more detail with reference to FIG. 4, along with FIGS. 2 and 3.

Referring to FIGS. 2-4, a test circuit 400 may include first and second TSVs 414 and 415, a transmitter 420, first and second delay circuits 430 and 440, and an output circuit 480. The first and second TSVs 414 and 415, the transmitter 420, the first and second delay circuits 430 and 440 may be configured to be operated in a manner similar to corresponding elements (e.g., identified with similar reference numbers) of FIG. 2 or 3. Thus, in the following description of the test circuit 400, technical features different from the test circuit 200 will be described mainly.

The test circuit 400 may include the output circuit 480, unlike the test circuits 200 and 300 described above. The output circuit 480 may receive output signals of the first delay circuit 430 and output signals of the second delay circuit 440. The output circuit 480 may output the output signals of the first delay circuit 430 and the output signals of the second delay circuit 440 to the outside of a semiconductor die in which the test circuit 400 is disposed, through at least one pad (not shown). For example, the output circuit 480 may include buffers (not shown) buffering the output signals of the first and second delay circuits 430 and 440.

The output signals of the first and second delay circuits 430 and 440 output by the output circuit 480 may be compared in an external test device or an external test circuit. In other words, the output signals of the first delay circuit 430 and the output signals of the second delay circuit 440 may be monitored by an external test device or a user, and the load of the first and second TSVs 414 and 415 may be determined through this process. The numbers of the output signals output from the first and second delay circuits 430 and 440 by the output circuit 480 are not limited to that shown in FIG. 4.

In some example embodiments, the test circuit 400 may further include the load determinator 250 of FIG. 2, the first and second multiplexers 360 and 370 of FIG. 3, and/or the load determinator 350 of FIG. 3. That is, the test circuit 400 may output the output signals of the first delay circuit 430 and the output signals of the second delay circuit 440 as they are to the outside or may output the afore-described first and second counting values to the outside.

Figure 5:
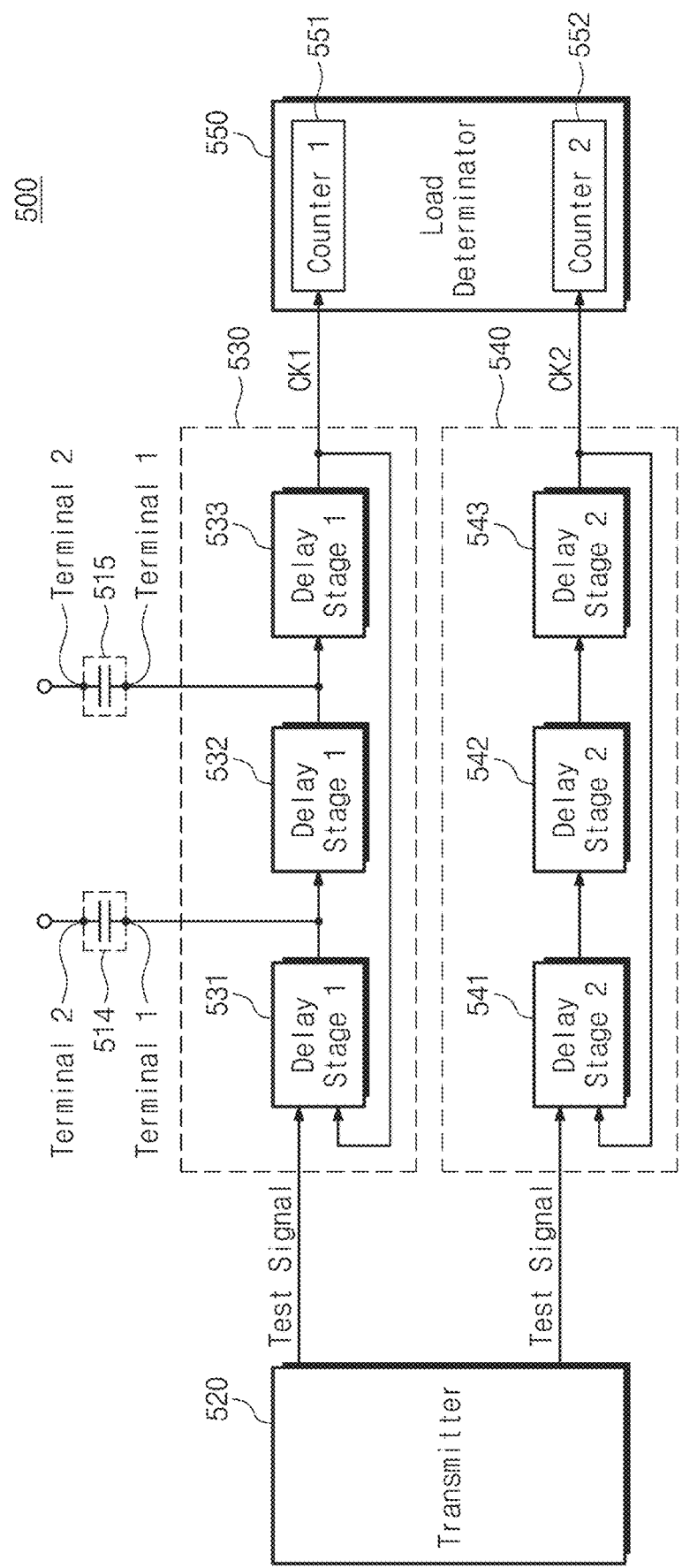
FIG. 5 is a block diagram illustrating a test circuit according to still other example embodiment of the inventive concepts.

FIG. 5 is a block diagram illustrating a test circuit according to still other example embodiments of the inventive concepts. The test circuit will be described in more detail with reference to FIG. 5, along with FIG. 2.

Referring to FIGS. 2 and 5, a test circuit 500 may include first and second TSVs 514 and 515, a transmitter 520, first and second delay circuits 530 and 540, and a load determinator 550. The first and second TSVs 514 and 515 may be the same as the first and second TSVs 214 and 215. Thus, in the following description of the test circuit 500, technical features different from the test circuit 200 will be described mainly.

The transmitter 520 may transmit a test signal to each of the first and second delay circuits 530 and 540. For example, the test signal may correspond to a logic '0' or a logic '1' and may be a trigger signal. The first and second delay circuits 530 and 540 may generate first and second clocks CK1 and CK2, respectively, and in this case, the test signal may be used for the generation of the first and second clocks CK1 and CK2.

The first delay circuit 530 may generate the first clock CK1 based on the test signal. An output terminal of a final first delay stage 533 may be connected to a first delay stage 531 receiving the test signal. The first delay stage 531 may receive the test signal and the output signal of the final first delay stage 533. The first delay circuit 530 may generate the first clock CK1 as a ring oscillator. Although the first delay circuit 530 is illustrated to include an odd number of the first delay stages 531-533, example embodiments of the inventive concepts are not limited thereto. Although not shown, an output terminal of the final first delay stage 533 may be connected to the first terminal of the TSV. The total number of logic gates, which are included in the first delay circuit 530 and are connected in series, may be an odd number.

The second delay circuit 540 may generate the second clock CK2 based on the test signal. An output terminal of a final second delay stage 543 may be connected to a second delay stage 541 receiving the test signal. Except that the first and second TSVs 514 and 515 (or at least one TSV) are connected to the first delay circuit 530, the second delay circuit 540 may be implemented to be similar to the first delay circuit 530.

The load determinator 550 may compare the first clock CK1 with the second clock CK2 and may determine a load of at least one TSV connected to the first delay circuit 530. For example, due to the load of the at least one TSV, a frequency of the first clock CK1 may be lower than a frequency of the second clock CK2. A first counter 551 may increase a first counting value at rising edges or falling edges of the first clock CK1. A second counter 552 may increase a second counting value at rising edges or falling edges of the second clock CK2.

In addition, a duty ratio of the first clock CK1 may be different from a duty ratio of the second clock CK2. For example, the first counter 551 may increase the first counting value only when the first clock CK1 is in a period corresponding to one of the logic '0' and the logic '1'. Similarly, the second counter 552 may also increase the second counting value only when the second clock CK2 is in a period corresponding to one of the logic '0' and the logic '1'.

Figure 6:
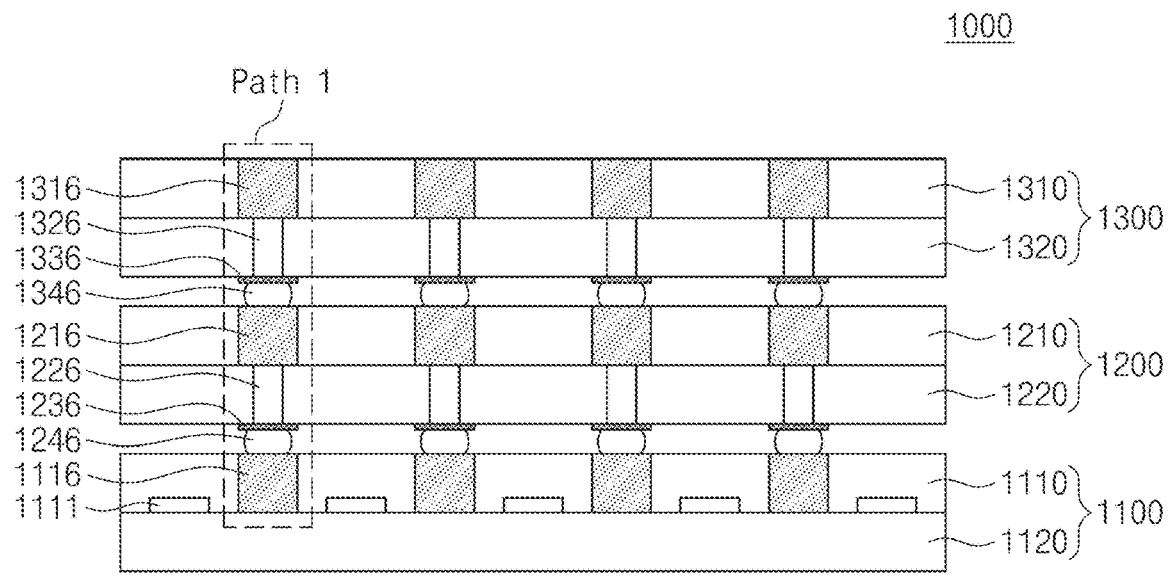
FIG. 6 is a sectional view illustrating a semiconductor device according to an example embodiment of the inventive concepts.

FIG. 6 is a sectional view illustrating a semiconductor device according to an example embodiment of the inventive concepts. The semiconductor device will be described in more detail with reference to FIG. 6, along with FIGS. 1 to 5. For convenience in illustration, the insulator of FIG. 1 is omitted from FIG. 6.

Referring to FIGS. 1-6, a semiconductor device 1000 may include a first semiconductor die 1100, a second semiconductor die 1200, and a third semiconductor die 1300.

The first semiconductor die 1100 may include a substrate 1110 and an interconnection layer 1120. In some example embodiments, the first semiconductor die 1100 may be the semiconductor die 100 described with reference to FIG. 1. The substrate 1110 may include circuit regions 1111 and TSVs 1116. Example embodiments of the inventive concepts are not limited to the structure of FIG. 6, and the number of the circuit regions 1111 and the number of the TSVs 1116 may be variously changed. The circuit regions 1111 may be disposed adjacent to the TSVs 1116, and one of the test circuits 200, 300, 400, and 500 previously described with reference to FIGS. 2 to 5 may be disposed or distributed in the circuit regions 1111.

The second semiconductor die 1200 may be stacked on the first semiconductor die 1100. Similar to the first semiconductor die 1100, the second semiconductor die 1200 may include a substrate 1210 and an interconnection layer 1220. The substrate 1210 may include TSVs 1216. The interconnection layer 1220 may include metal lines 1226 configured to connect the TSVs 1116 of the first semiconductor die 1100 and the TSVs 1216 of the second semiconductor die 1200, respectively. The second semiconductor die 1200 may include pads 1236 electrically connected to the metal lines 1226.

Bumps 1246 may be disposed on the first semiconductor die 1100, and in a plan view, positions of the bumps 1246 may correspond to or may overlap positions of the TSVs 1116 of the first semiconductor die 1100 and positions of the pads 1236 of the second semiconductor die 1200. The bumps 1246 may be, for example, micro bumps or solder balls.

The second semiconductor die 1200 may receive or transmit signals from or to the first semiconductor die 1100 through the TSVs 1116, the bumps 1246, the pads 1236, the metal lines 1226. For example, the first semiconductor die 1100 may receive a command for the second semiconductor die 1200 from the outside, may transmit the command to the second semiconductor die 1200, and may receive a processing result of the command from the second semiconductor die 1200.

The third semiconductor die 1300 may be stacked on the second semiconductor die 1200. The third semiconductor die 1300 may include a substrate 1310 and an interconnection layer 1320. In some example embodiments, the third semiconductor die 1300 may be fabricated to be the same as the second semiconductor die 1200.

The third semiconductor die 1300 may receive or transmit signals from and/or to the first semiconductor die 1100 through the TSVs 1116, the bumps 1246, the pads 1236, the metal lines 1226, the TSVs 1216, bumps 1346, pads 1336, and metal lines 1326. For example, the first semiconductor die 1100 may receive a command for the third semiconductor die 1300 from the outside, may transmit the command to the third semiconductor die 1300, and may receive a processing result of the command from the third semiconductor die 1300. For example, the first semiconductor die 1100 may be a logic die or a buffer die configured to control the second and third semiconductor dies 1200 and 1300.

In other example embodiments, unlike that shown in FIG. 6, only the second semiconductor die 1200 may be stacked on the first semiconductor die 1100. As described above, the first semiconductor die 1100 may include one of the test circuits 200, 300, and 500 described with reference to FIGS. 2 to 5. In this case, each of the TSVs 214, 215, 314, 315, 414, 415, 514, and 515 may represent a total load of one of the TSVs 1116 of the first semiconductor die 1100, one of the TSVs 1216 of the second semiconductor die 1200, and metal lines, pads, and at least one bump configured to electrically connect such TSVs.

Thus, propagation delays of the first delay circuits 230, 330, 430, and 530 may be determined based on a load of at least one TSV of the first semiconductor die 1100 and a load of at least one TSV of the second semiconductor die 1200. However, propagation delays of the second delay circuits 240, 340, 440, or 540 may be determined based on input capacitance of each of the second delay stages 241, 242, 341, 342, 541, and 542 and the metal line connecting the delay stages, regardless of whether or not the second semiconductor die 1200 is stacked on the first semiconductor die 1100.

The load determinators 250, 350, and 550 may determine a total load of at least one of the TSVs 1116 of the first semiconductor die 1100, at least one of the TSVs 1216 of the second semiconductor die 1200, and metal lines, pads, and at least one bump configured to electrically connect such TSVs. Here, the total load may include all of the load of at least one TSV of the first semiconductor die 1100, the load of at least one TSV of the second semiconductor die 1200, the load of the metal line, the load of the pad, and the load of the at least one bump.

Example embodiments of the inventive concepts are not limited to the number of semiconductor dies stacked on the first semiconductor die 1100. For example, as the number of the semiconductor dies stacked on the first semiconductor die 1100 increases, a total load of TSVs and metal lines, pads, and bumps configured to electrically connect the TSVs which are included in a first path may increase. In other words, the test circuit in the first semiconductor die 1100 (e.g., one of the test circuits 200, 300, 400, and 500 of FIGS. 2 to 5) may determine a load of not only at least one TSV of the first semiconductor die 1100 but also TSVs of other semiconductor dies stacked on the first semiconductor die 1100.

FIG. 6 illustrates an example in which the lowermost semiconductor die (i.e., the first semiconductor die 1100) has the test circuit, but the second and third semiconductor dies 1200 and 1300 may also have such a test circuit. For the sake of simplicity, the description that follows will refer to an example in which the second and third semiconductor dies 1200 and 1300 have the test circuit.

Figure 7:
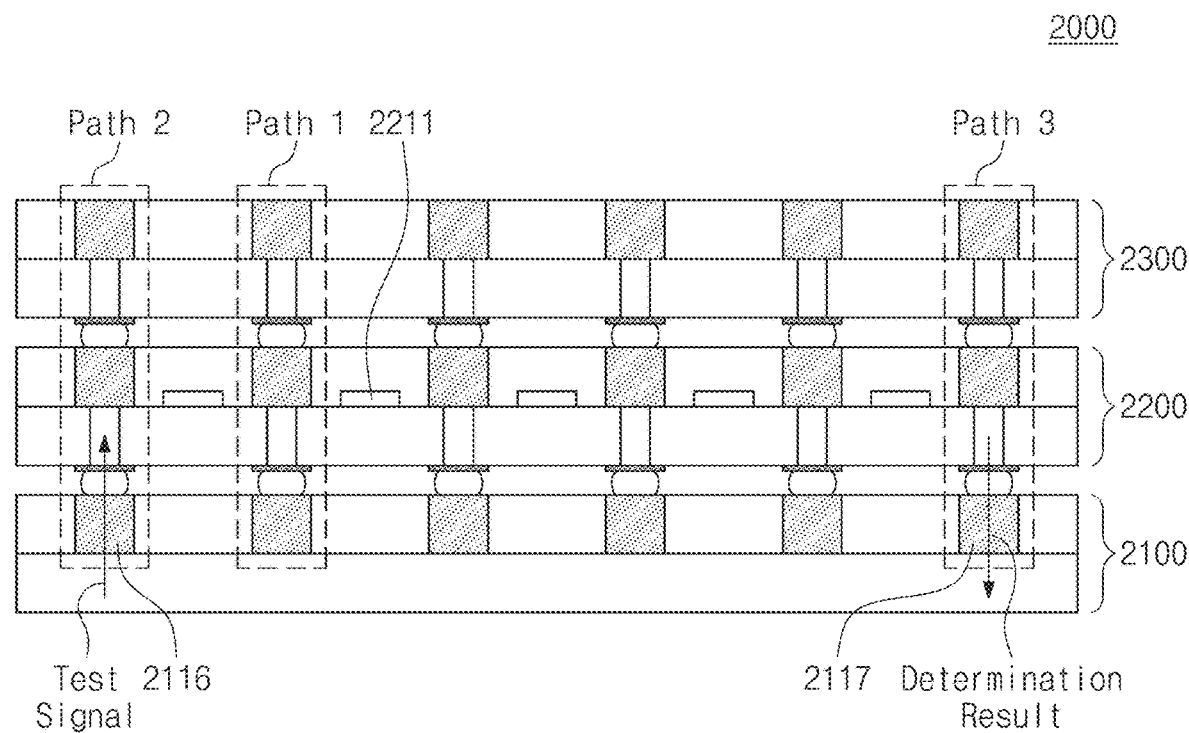
FIG. 7 is a sectional view illustrating a semiconductor device according another example embodiment of the inventive concepts.

FIG. 7 is a sectional view illustrating a semiconductor device according another example embodiment of the inventive concepts. A semiconductor device 2000 according another example embodiment of the inventive concepts will be described in more detail with reference to FIG. 7, along with FIGS. 1 to 6.

Referring to FIGS. 1-7, the semiconductor device 2000 may include a first semiconductor die 2100, a second semiconductor die 2200, and a third semiconductor die 2300. The first to third semiconductor dies 2100-2300 may be similar to the first to third semiconductor dies 1100-1300. In the embodiment of FIG. 7, a test circuit may be disposed in circuit regions 2111 of the second semiconductor die 2200.

Unlike that shown in FIG. 7, only the second semiconductor die 2200 may be stacked on the first semiconductor die 2100. The second semiconductor die 2200 may include one of the test circuits 200, 300, 400, and 500 previously described with reference to FIGS. 2 to 5. In this case, each of the TSVs 214, 215, 314, 315, 414, 415, 514, and 515 may represent a total load of one of TSVs of the first semiconductor die 2100, one of TSVs of the second semiconductor die 2200, and metal lines, pads, and at least one bump configured to electrically connect such TSVs. Propagation delays of the first delay circuits 230, 330, and 530 may be determined based on a load of at least one TSV of the first semiconductor die 2100 and at least one TSV of the second semiconductor die 2200. The load determinators 250, 350, and 550 may determine the load.

Example embodiments of the inventive concepts are not limited to the number of semiconductor dies stacked on the first semiconductor die 2100. For example, as the semiconductor dies stacked on the first semiconductor die 2100 increase, a total load of TSVs and metal lines, pads, and bumps configured to electrically connect the TSVs which are included in a first path may increase and is represented by each of the TSVs 214, 215, 314, 315, 414, 415, 514, and 515. The test circuit in the second semiconductor die 2200 (e.g., the test circuits 200, 300, 400, and 500 of FIGS. 2 to 5) may determine a load of not only a TSV of the first semiconductor die 2100 but also TSVs of other semiconductor dies stacked on the first semiconductor die 2100.

In some example embodiments, the test circuit in the second semiconductor die 2200 may receive a test signal or a command requesting generation of the test signal, from the first semiconductor die 2100 through a second path. The test circuit may transmit a determination result to the first semiconductor die 2100 through a third path. For example, the test circuit may transmit a determination result, along with a stack identifier of the second semiconductor die 2200 in which the test circuit are disposed, to the first semiconductor die 2100.

For example, the first semiconductor die 2100 may further include at least one TSV (e.g., a TSV 2116 which is included in the second path and is disposed in the first semiconductor die 2100) through which a test signal or a command is transmitted. The TSV through which the test signal or the command is transmitted, may be failed or may not be suitable to transmit a signal, and thus, the number of the TSV through which the test signal or the command is transmitted, may be at least one.

In some example embodiments, the first semiconductor die 2100 may further include at least one TSV (e.g., a TSV 2117 which is included in the third path and is disposed in the first semiconductor die 2100) for receiving a determination result of the test circuit from the second semiconductor die 2200. The TSV for receiving the determination result may be failed or may not be suitable to receive a signal, and thus, the number of the TSV for receiving the determination result, may be at least one.

In some example embodiments, the third semiconductor die 2300 may be fabricated to be the same as the second semiconductor die 2200. For example, similar to the second semiconductor die 2200, the third semiconductor die 2300 may include a test circuit and the test circuit may determine a total load of TSVs and metal lines, pads, and bumps configured to electrically connect the TSVs which are included in the first path. For example, the second semiconductor die 2200 may further include at least one TSV (e.g., a TSV which is included in the second path and is disposed in the second semiconductor die 2200) through which a test signal or a command is transmitted, similar to the first semiconductor die 2100. Furthermore, the second semiconductor die 2200 may further include at least one TSV (e.g., a TSV which is included in the third path and is disposed in the second semiconductor die 2200) for receiving a determination result of the test circuit from the third semiconductor die 2300, similar to the first semiconductor die 2100.

Figure 8:
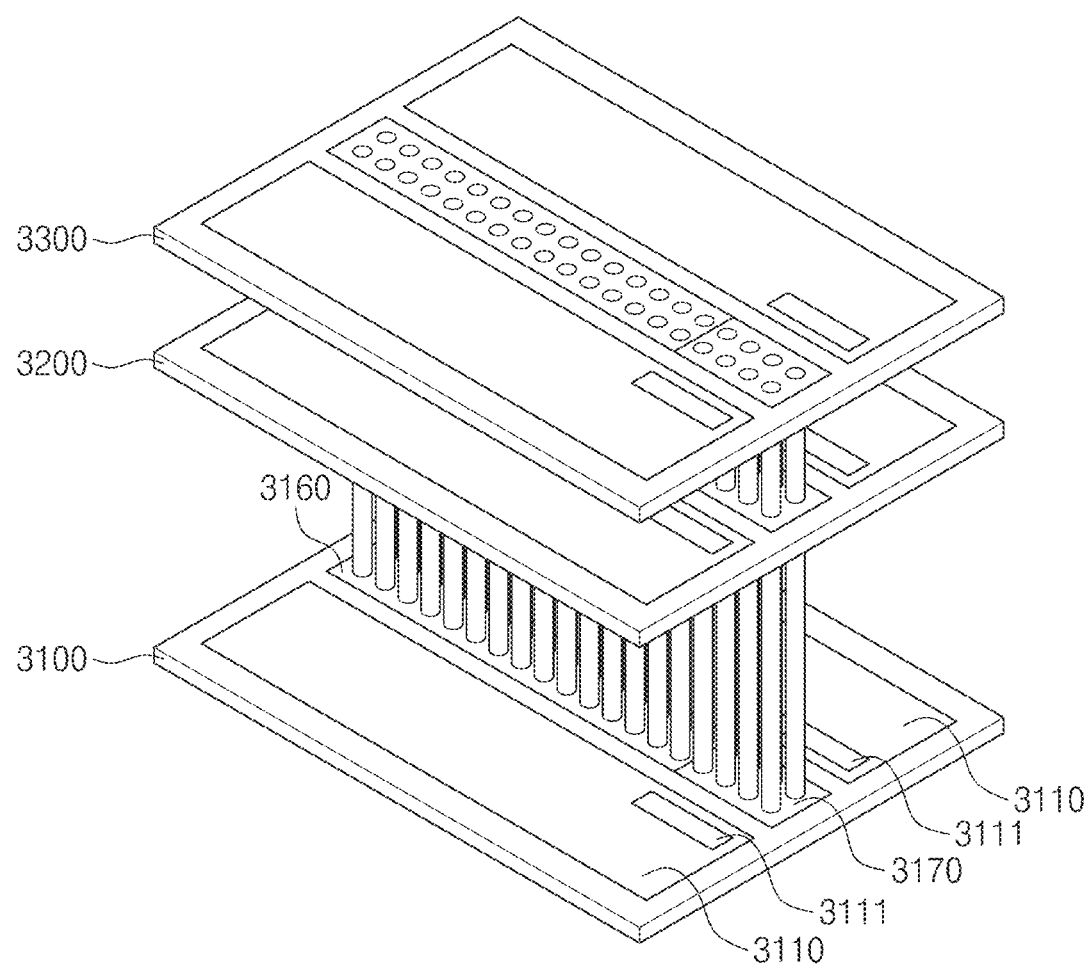
FIG. 8 is a perspective view illustrating a semiconductor device according to other example embodiment of the inventive concepts.

FIG. 8 is a perspective view illustrating a semiconductor device according to other example embodiments of the inventive concepts. The semiconductor device according to other example embodiments of the inventive concepts will be described in more detail with reference to FIG. 8, along with FIGS. 6 and 7. The bumps of FIGS. 6 and 7 are omitted from FIG. 8.

Referring to FIGS. 6-8, a semiconductor device 3000 may include a first semiconductor die 3100, a second semiconductor die 3200, and a third semiconductor die 3300.

The first semiconductor die 3100 may be similar to the first semiconductor die 1100 previously described with reference to FIG. 6. The first semiconductor die 3100 may include a circuit region 3110, a first TSV region 3160, and a second TSV region 3170. The circuit region 3110 may include a memory cell array, a peripheral circuit controlling the memory cell array, a logic circuit, or a combination of thereof. The circuit region 3110 may include a test circuit region 3111, in which the test circuits 200, 300, 400, and 500 previously described with reference to FIGS. 2 to 5 are disposed.

Normal TSVs may be disposed on the first TSV region 3160. The normal TSVs may be used for a test process and may be also used for signal exchange or signal transmission between the first to third semiconductor dies 3100-3300 in general circumstances.

Test TSVs may be disposed on the second TSV region 3170. In some example embodiments, the first to third semiconductor dies 3100-3300 may further include the test TSVs which are used for only a test process or are used to determine electric characteristics (i.e., a load) of TSVs of the semiconductor device 3000, in addition to the normal TSVs. The test TSVs may include the TSVs 114, 115, 214, 215, 314, 315, 414, 415, 514, and 515 previously described with reference to FIGS. 1 to 5.

Although FIG. 8 illustrates an example in which the first and second TSV regions 3160 and 3170 are disposed at a center region of the first semiconductor die 3100, example embodiments of the inventive concepts are not limited thereto. For example, the first and second TSV regions 3160 and 3170 may be disposed at an edge region of the first semiconductor die 3100.

The second semiconductor die 3200 may be similar to the second semiconductor die 2200 previously described with reference to FIG. 7. The third semiconductor die 3300 may be similar to the third semiconductor die 2300 previously described with reference to FIG. 7. Each of the second and third semiconductor dies 3200 and 3300 may include a circuit region, a first TSV region, and a second TSV region, similar to the first semiconductor die 3100. That is, according to some example embodiments of the inventive concepts, the test circuit may be disposed in the logic die (e.g., the first semiconductor die 3100) and the memory dies (e.g., the second and third semiconductor dies 3200 and 3300), respectively.

Figure 9:
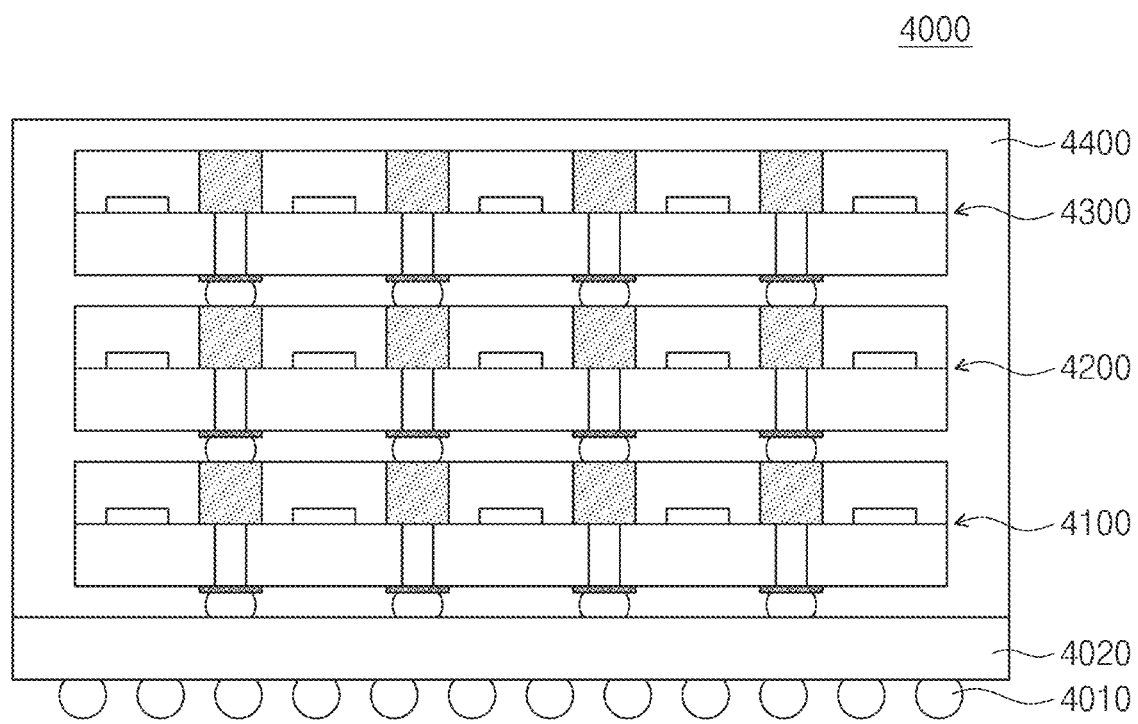
FIG. 9 is a sectional view illustrating an electronic device according to an example embodiment of the inventive concepts.

FIG. 9 is a sectional view illustrating an electronic device according to an example embodiment of the inventive concepts.

Referring to FIG. 9, an electronic device 4000 may include a package substrate 4020 to which external terminals 4010 are attached, a first semiconductor die 4100 stacked on the package substrate 4020, a second semiconductor die 4200 stacked on the first semiconductor die 4100, a third semiconductor die 4300 stacked on the second semiconductor die 4200, and a mold layer 4400 covering the first to third semiconductor dies 4100-4300. For example, the electronic device 4000 may be one of servers, computers, smart phones, tablets, personal digital assistants (PDAs), digital cameras, portable multimedia players (PMPs), wearable devices, or internet of things (IoT) devices.

In some example embodiments, the first semiconductor die 4100 may be one of the first semiconductor dies 1100, 2100, and 3100 previously described with reference to FIGS. 6 to 8. The first semiconductor die 4100 may be stacked on the package substrate 4020 using bumps. The second semiconductor die 4200 may be one of the second semiconductor dies 1200, 2200, and 3200 previously described with reference to FIGS. 6 to 8. The third semiconductor die 4300 may be one of the third semiconductor dies 1300, 2300, and 3300 previously described with reference to FIGS. 6 to 8. In this case, the first semiconductor die 4100 may be a logic die configured to control the second and third semiconductor dies 4200 and 4300, and the second and third semiconductor dies 4200 and 4300 may be memory dies.

In some example embodiments, the first semiconductor die 4100 may be a processor (e.g., an application processor, a central processing unit (CPU), or a graphic processing unit (GPU)), which is configured to control an overall operation of the electronic device 4000. The first semiconductor die 4100 may execute a program, in accordance with an application that can be supported by the electronic device 4000, and may receive or transmit data associated with an execution of the program or are results of the execution of the program, from or to the second semiconductor die 4200. In this case, the second semiconductor die 4200 may be a logic die configured to control the third semiconductor die 4300, and the third semiconductor die 4300 may be a memory die. That is, in the electronic device 4000 according to some example embodiments of the inventive concepts, memory dies may be stacked on a processor.

Figure 10:
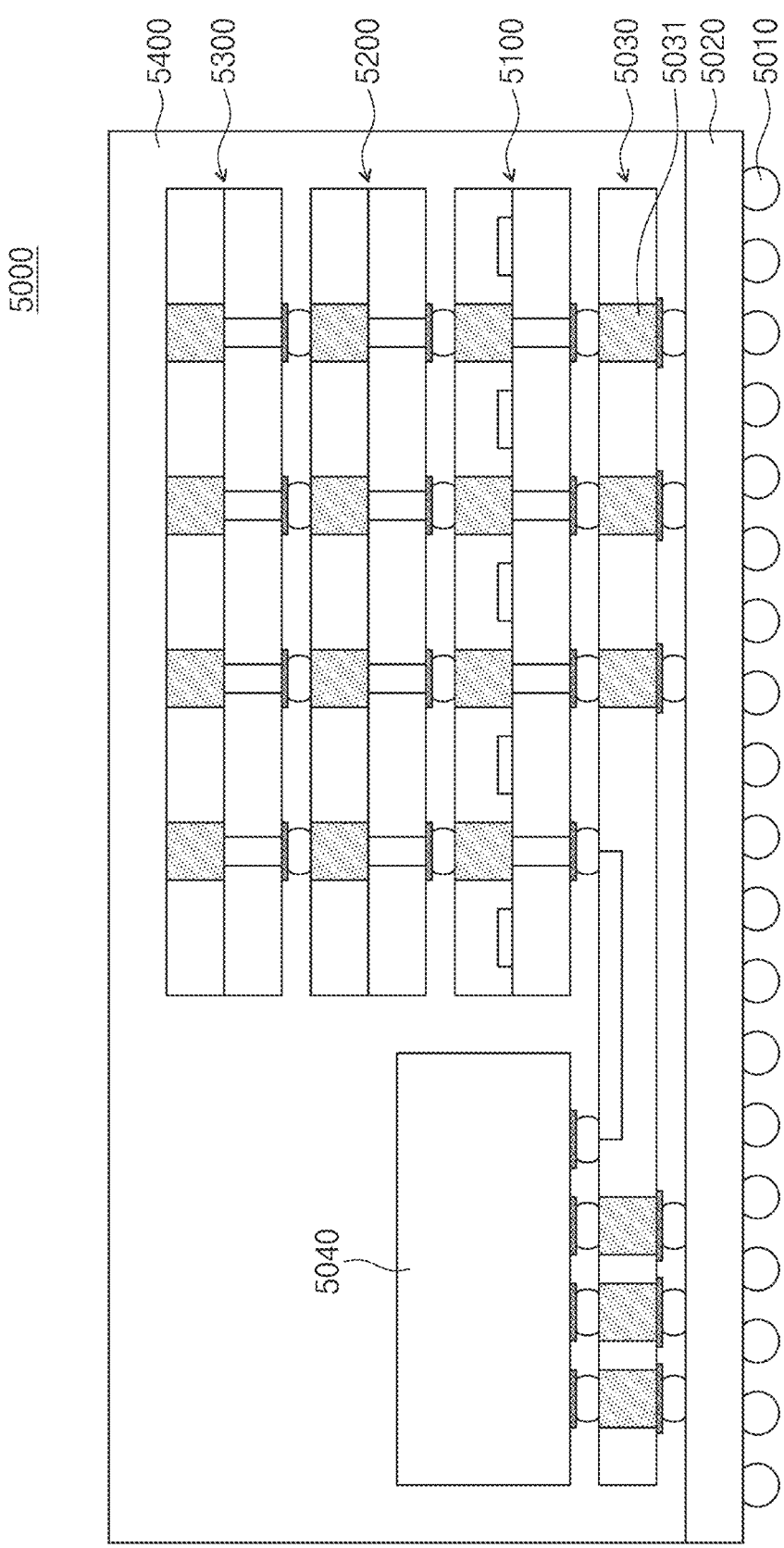
FIG. 10 is a sectional view illustrating an electronic device according to another example embodiment of the inventive concepts.

FIG. 10 is a sectional view illustrating an electronic device according to another example embodiment of the inventive concepts. The electronic device will be described in more detail with reference to FIG. 10, along with FIG. 9.

Referring to FIGS. 9 and 10, an electronic device 5000 may include a package substrate 5020 attached with external terminals 5010, an interposer 5030 stacked on the package substrate 5020, a processor 5040 stacked on the interposer 5030, a first semiconductor die 5100 stacked on the interposer 5030, a second semiconductor die 5200 stacked on the first semiconductor die 5100, a third semiconductor die 5300 stacked on the second semiconductor die 5200, and a mold layer 5400. The mold layer 5400 may be provided to cover the interposer 5030, the processor 5040, and the first to third semiconductor dies 5100-5300.

FIG. 10 illustrates another example, in which the first to third semiconductor dies 5100-5300 are not stacked on the processor 5040 as compared to FIG. 9, which illustrates an example, in which memory dies are stacked on a processor. Instead, the electronic device 5000 of FIG. 10 may further include the interposer 5030 configured to connect the processor 5040 and the first to third semiconductor dies 5100-5300. The interposer 5030 may include TSVs 5031 configured to electrically connect the processor 5040 and the package substrate 5020, and electrically connect the first semiconductor die 5100 and the package substrate 5020. Furthermore, the interposer 5030 may further include metal lines configured to electrically connect the processor 5040 and the first semiconductor die 5100.

Each of the first to third semiconductor dies 5100-5300 may be referred to as a memory die. The first semiconductor die 5100 may be one of the first semiconductor dies 1100, 2100, and 3100 previously described with reference to FIGS. 6 to 8. The second semiconductor die 5200 may be one of the second semiconductor dies 1200, 2200, and 3200 previously described with reference to FIGS. 6 to 8. The third semiconductor die 5300 may be one of the third semiconductor dies 1300, 2300, and 3300 previously described with reference to FIGS. 6 to 8.

According to an example embodiment of the inventive concepts, a signal output from a delay stage connected to a TSV, not a signal passing through the TSV, is used to test the TSV. Since the TSV may operate as a load of the delay stage, the signal output from the delay stage may be delayed by the load of the TSV. Thus, the load of the TSV may be determined or measured by determining the signal output from the delay stage.

According to one or more example embodiments, the units and/or devices described above including elements of the test circuits 200, 300, 400, 500 such as the first delay circuits, the second delay circuits, the load determinators, and the multiplexers and sub-elements thereof such as the first counter and the second counter, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a first semiconductor die including,
first delay stages connected in series, the first delay stages configured to receive a test signal, one of the first delay stages configured to output a first delay signal,
second delay stages connected in series, the second delay stages configured to receive the test signal, one of the second delay stages configured to output a second delay signal,
at least one first through silicon via connected to at least one output terminal of output terminals of the first delay stages, and
processing circuitry configured to determine a load of the at least one first through silicon via and at least one second through silicon via based on the first delay signal and the second delay signal; and
a second semiconductor die stacked on the first semiconductor die, the second semiconductor die including the at least one second through silicon via electrically connected to the at least one first through silicon via.

2. The semiconductor device of claim 1, wherein
a first propagation delay of one of the first delay stages connected to the at least one of the output terminals is influenced by the at least one first through silicon via, and
output terminals of the second delay stages are not connected to the at least one first through silicon via and the at least one second through silicon via such that a second propagation delay of each of the second delay stages is not influenced by the at least one first through silicon via and the at least one second through silicon via.

3. The semiconductor device of claim 1, wherein
each of the second delay stages includes a same at least one logic gate as corresponding ones of the first delay stages, and
each of the second delay stages is adjacent to each of the first delay stages.

4. The semiconductor device of claim 1, wherein the first semiconductor die is a logic die configured to,
receive a command of the second semiconductor die,
transmit the command to the second semiconductor die, and
receive a processing result of the command from the second semiconductor die.

5. The semiconductor device of claim 1, further comprising:
at least one bump electrically connecting the at least one first through silicon via and the at least one second through silicon via, wherein
the processing circuitry is configured to determine a load of the at least one first through silicon via, the at least one second through silicon via, and the at least one bump.

6. A semiconductor device, comprising:
a first semiconductor die including at least one first through silicon via; and
a second semiconductor die stacked on the first semiconductor die, the second semiconductor die including,
first delay stages connected in series, the first delay stages including output terminals, one of the first delay stages configured to output a first delay signal,
second delay stages connected in series, one of the second delay stages configured to output a second delay signal,
at least one second through silicon via electrically connected to at least one of the output terminals of the first delay stages and the at least one first through silicon via,
a transmitter configured to transmit a test signal received from the first semiconductor die to the first delay stages and the second delay stages, and
processing circuitry configured to determine a load of the at least one first through silicon via and the at least one second through silicon via based on the first delay signal and the second delay signal.

7. The semiconductor device of claim 6, further comprising:
a third semiconductor die stacked on the second semiconductor die, the third semiconductor die including at least one third through silicon via electrically connected to the at least one first through silicon via and the at least one second through silicon via, wherein
the processing circuitry is configured to determine the load of the at least one first through silicon via, the at least one second through silicon via, and the at least one third through silicon via, which are electrically connected to each other.

8. The semiconductor device of claim 6, wherein a structure of the first semiconductor die is same as structure of the second semiconductor die.

9. The semiconductor device of claim 6, wherein the first semiconductor die is a logic die configured to,
receive a command of the second semiconductor die,
transmit the command to the second semiconductor die, and
receive a processing result of the command from the second semiconductor die.

10. The semiconductor device of claim 9, wherein the processing circuitry is further configured to transmit a determination result and a stack identifier of the second semiconductor die to the first semiconductor die.

11. The semiconductor device of claim 10, wherein the first semiconductor die further comprises:
at least one fourth through silicon via configured to receive the determination result.

12. The semiconductor device of claim 11, wherein the first semiconductor die further comprises:
at least one fifth through silicon via through which the test signal is transmitted.

* * * * *